(12) United States Patent
Li et al.

(10) Patent No.: US 10,101,175 B2
(45) Date of Patent: Oct. 16, 2018

(54) SENSOR INTERFACE CIRCUIT AND SENSOR OUTPUT ADJUSTING METHOD

(71) Applicant: Industrial Technology Research Institute, Hsinchu (TW)

(72) Inventors: Sih-Han Li, New Taipei (TW);
Shyh-Shyuan Sheu, Taipei (TW);
Ya-Wen Yang, Taichung (TW);
Chih-Ping Cheng, Taoyuan (TW);
Chih-Sheng Lin, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/607,389

(22) Filed: May 26, 2017

(65) Prior Publication Data

US 2018/0136010 A1    May 17, 2018

Related U.S. Application Data

(60) Provisional application No. 62/422,219, filed on Nov. 15, 2016.

(51) Int. Cl.
*G01D 3/02* (2006.01)
*G01D 18/00* (2006.01)
*H03K 17/30* (2006.01)

(52) U.S. Cl.
CPC ........... *G01D 3/022* (2013.01); *G01D 18/008* (2013.01); *H03K 17/30* (2013.01); *G01B 2210/60* (2013.01)

(58) Field of Classification Search
CPC .... G01B 2210/60; G01D 3/022; G01D 18/00; G01D 18/008

USPC .......................................... 327/365, 509, 590
See application file for complete search history.

(56) References Cited

U.S. PATENT DOCUMENTS

| | | | |
|---|---|---|---|
| 5,600,147 A | 2/1997 | Jensen | |
| 5,629,481 A * | 5/1997 | Sultan | G01F 1/6888 73/204.16 |
| 5,677,634 A * | 10/1997 | Cooke | G01R 31/028 324/519 |
| 6,744,376 B1 | 6/2004 | Pascalidis | |

(Continued)

FOREIGN PATENT DOCUMENTS

| | | |
|---|---|---|
| TW | 201234266 | 8/2012 |
| TW | 201405099 | 2/2014 |
| TW | 201618510 | 5/2016 |

OTHER PUBLICATIONS

Yang et al., "Configurable Hardware-Effcient Interface Circuit for Multi-Sensor Microsystems," IEEE Sensors 2006, Oct. 2006, pp. 41-44, IEEE, US.

(Continued)

*Primary Examiner* — William Hernandez

(57) ABSTRACT

A sensor interface circuit and sensor output adjusting method are provided. The sensor interface circuit includes a processor and a gain control circuit. The processor obtains information of a linear region of a sensor to set a configuration corresponding to the sensor. The gain control circuit is coupled to the processor, performs a return-to-zero operation for a maximum electronic value and a minimum electronic value corresponding to the linear region and performs a full-scale operation for a slope of the linear region according to the maximum input range of an analog-to-digital converter which is a subsequent-stage circuit of the sensor interface circuit.

22 Claims, 9 Drawing Sheets

(56) References Cited

U.S. PATENT DOCUMENTS

| | | |
|---|---|---|
| 6,792,309 B1 | 9/2004 | Noren |
| 6,832,178 B1 | 12/2004 | Fernandez et al. |
| 7,065,465 B2 | 6/2006 | Chen et al. |
| 2005/0238123 A1 | 10/2005 | Ranganathan et al. |
| 2007/0185673 A1 | 8/2007 | Hubanks et al. |
| 2007/0272551 A1 | 11/2007 | Inagaki et al. |
| 2014/0072308 A1 | 3/2014 | Jain et al. |
| 2014/0351558 A1 | 11/2014 | Burca et al. |
| 2016/0047852 A1 | 2/2016 | Poisson et al. |

OTHER PUBLICATIONS

Jia et al., "Trade-offs in the Design of a Universal Sensor Interface Chip," 2009 IEEE $8^{th}$ International Conference on ASIC, Oct. 2009, pp. 871-874, IEEE, US.

Huang et al., "A Self-Powered CMOS Reconfigurable Multi-Sensor SoC for Biomedical Applications," IEEE Journal of Solid-State Circuits, Apr. 2014, pp. 851-866, vol. 49, No. 4, IEEE, US.

\* cited by examiner

SENSOR INTERFACE CIRCUIT AND SENSOR OUTPUT ADJUSTING METHOD

CROSS REFERENCE TO RELATED APPLICATIONS

This Application claims priority of U.S. Provisional Patent Application No. 62/422,219, filed on Nov. 15, 2016, the entirety of which is incorporated by reference herein.

BACKGROUND OF THE INVENTION

Field of the Invention

The disclosure generally relates to a sensor interface circuit technology, and more particularly, to a sensor interface circuit which may be applied in different kinds of sensors and standardized sensor output of the different kinds of sensors.

Description of the Related Art

Different kinds of sensors have been developed for different applications. In the conventional development of a new sensor, the new sensor needs to be verified by an verification platform. However, if the verification platform cannot meet the requirements of the new sensor, a new verification platform must be designed. Therefore, the time it takes to develop the sensor will be extended.

In addition, each type of sensor may have different property information or need a different driving circuit. Namely, each type of sensor may need its own dedicated sensor interface circuit for its development and verification. Therefore, the development and verification of different kinds of sensors will lack efficiency and flexibility.

BRIEF SUMMARY OF THE INVENTION

A sensor interface circuit sensing signal and sensor output adjusting method are provided to overcome the problems mentioned above.

An embodiment of the disclosure provides a sensor interface circuit. The sensor interface circuit comprises a processor and a gain control circuit. The processor obtains information of a linear region of a sensor to set a configuration corresponding to the sensor. The gain control circuit is coupled to the processor, performs a return-to-zero operation for a maximum electronic value and a minimum electronic value corresponding to the linear region and performs a full-scale operation for a slope of the linear region according to the maximum input range of an analog-to-digital converter which is a subsequent-stage circuit of the sensor interface circuit. The processor further defines the sensor range according to the linear region.

In some embodiments of the disclosure, the sensor interface circuit further comprises a storage device. The storage device is coupled to the processor and stores related parameters corresponding to the linear region and the configuration corresponding to the sensor.

In some embodiments of the disclosure, the sensor interface circuit further comprises a driver circuit. The driver circuit is coupled to the processor and transmits a driving source to the sensor. The processor calibrates the value of the driving source according to the linear region of the sensor.

In some embodiments of the disclosure, the processor sweeps environment values and obtains the linear region of the sensor according to the swept environment values. In some embodiments of the disclosure, the storage device of the sensor interface circuit stores property information of the sensor in advance and the processor reads the property information of the sensor and obtains the linear region of the sensor according to the property information.

In some embodiments of the disclosure, the sensor interface circuit further comprises an offset cancellation circuit. The offset cancellation circuit is coupled to the gain control circuit and cancels an offset of a sensor output. In some embodiments of the disclosure, the processor selects a target region from the linear region.

An embodiment of the disclosure provides a sensor output adjusting method for a sensor. The sensor output adjusting method comprises the steps of obtaining a linear region of the sensor; performing a return-to-zero operation for a maximum electronic value and a minimum electronic value corresponding to the linear region; and performing a full-scale operation for a slope of the linear region according to a maximum input range of an analog-to-digital converter which is a subsequent-stage circuit of the sensor interface circuit; and setting a configuration corresponding to the sensor. The sensor output adjusting method further comprises the step of storing related parameters corresponding to the linear region and the configuration corresponding to the sensor.

Other aspects and features of the disclosure will become apparent to those with ordinary skill in the art upon review of the following descriptions of specific embodiments of a sensor interface circuit and a sensor output adjusting method for a sensor.

BRIEF DESCRIPTION OF THE DRAWINGS

The disclosure will become more fully understood by referring to the following detailed description with reference to the accompanying drawings, wherein.

DETAILED DESCRIPTION OF THE INVENTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
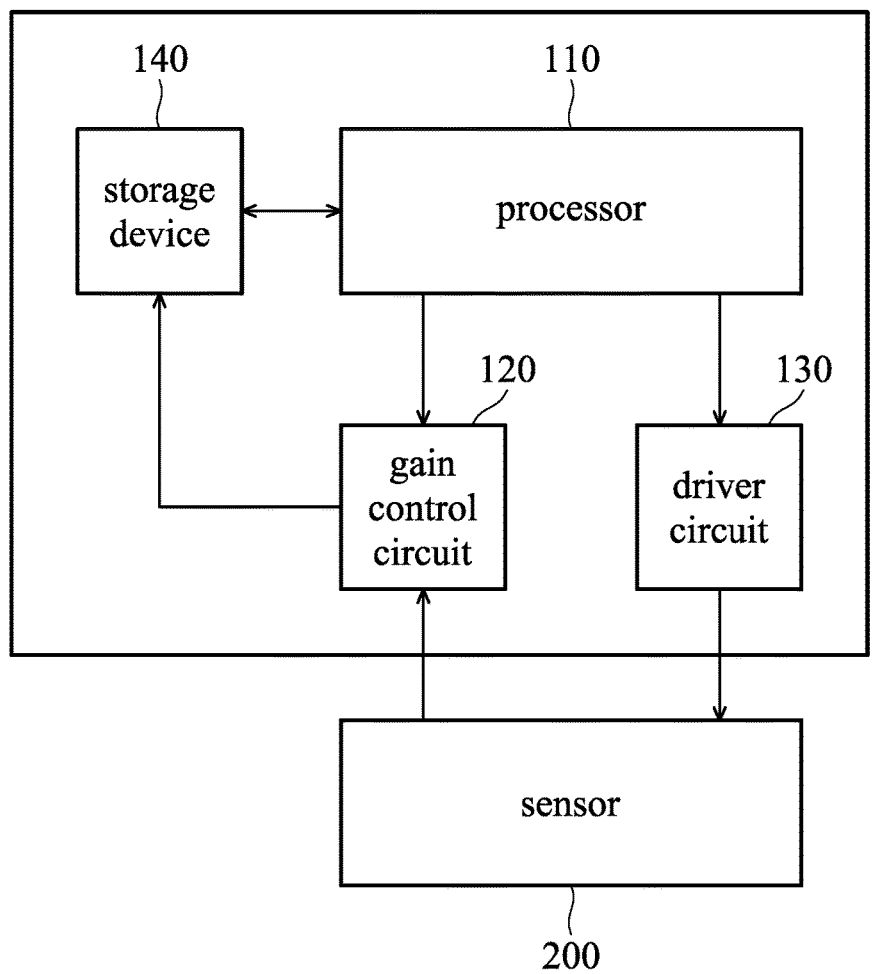
FIG. 1 is a block diagram of a sensor interface circuit 100 according to an embodiment of the disclosure.
Figure 2A:
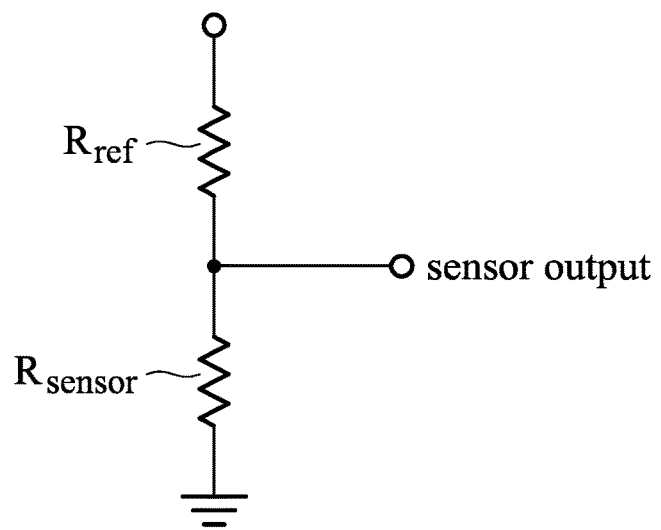
FIG. 2A is a schematic diagram illustrating of one kind of sensor according to an embodiment of the disclosure.
Figure 2B:
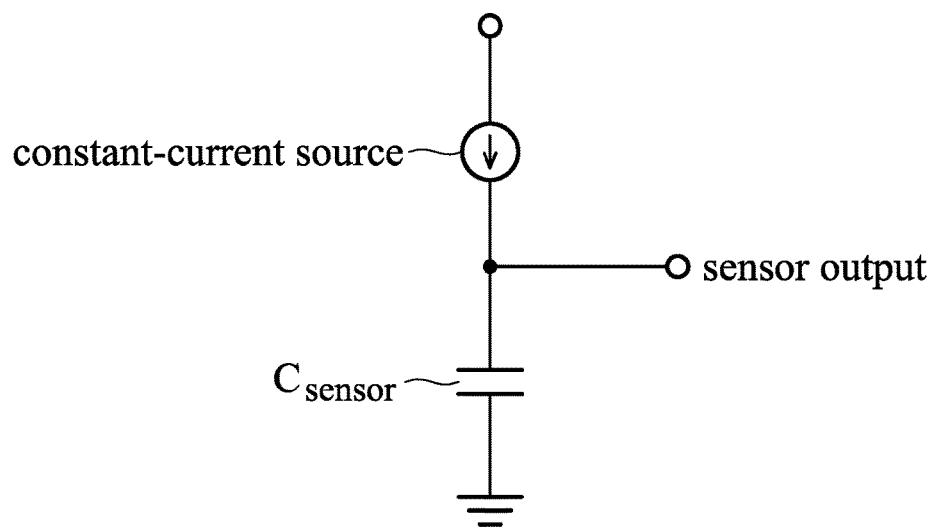
FIG. 2B is a schematic diagram illustrating of one kind of sensor according to another embodiment of the disclosure.

FIG. 1 is a block diagram of a sensor interface circuit 100 according to an embodiment of the disclosure. The sensor interface circuit 100 may be applied to an verification platform for the development of different kinds of sensors. That is to say, the sensor interface circuit 100 can be applied to the different kinds of sensors, such as a voltage-excited-voltage-output sensor which is derived by the voltage (as shown in FIG. 2A) or a current-excited-voltage-output sensor which is derived by the current (as shown in FIG. 2B), but the disclosure should not be limited to these sensors.

The sensor interface circuit 100 comprises a processor 110, a gain control circuit 120, a driver circuit 130 and a storage device 140. Note that, in order to clarify the concept of the disclosure, FIG. 1 presents a simplified block diagram in which only the elements relevant to the disclosure are shown. However, the disclosure should not be limited to what is shown in FIG. 1.

Figure 3A:
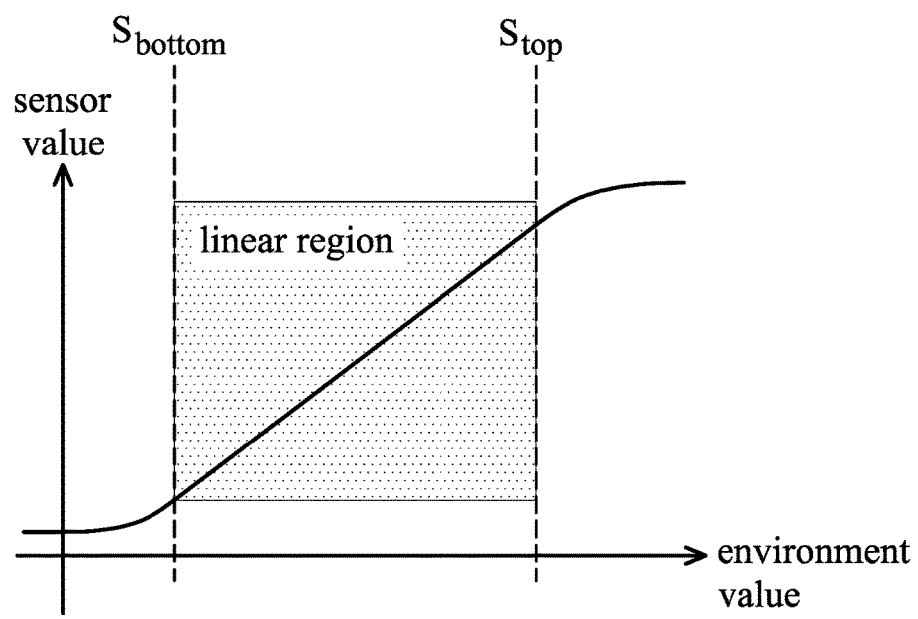
FIGS. 3A-3C are schematic diagrams illustrating the linear region according to an embodiment of the disclosure.

In an embodiment of the disclosure, when a sensor 200 is connected to the sensor interface circuit 100, the processor 110 may sweep the environment values corresponding to the sensor 200 to obtain information of a linear region (as shown in FIG. 3A) and other related property information (e.g. sensitivity of the sensor 200) of the sensor 200. For example, if the sensing environment of the sensor 200 corresponds to current, the processor 110 may sweep the environment values corresponding to the sensor 200 from 0 A to 100 A. After the processor 110 sweeps the environment values corresponding to the sensor 200, the sensor 200 may generate the sensor values corresponding to the current range (0 A~100 A) and then transform the sensor values to the electronic values of the sensor 200 according to the topology of the sensor 200 (as shown in FIG. 2A). Then, the processor 110 will obtain the information of the linear region of the sensor 200. Using FIGS. 3A and 3B as an example, when the processor 110 sweeps the environment values corresponding to the sensor 200, the sensor 200 may generate the sensor values corresponding to the current range of the swept environment values and then transform the sensor values to the electronic values of the sensor 200 according to the topology of the sensor 200. After the electronic values of the sensor 200 are generated, the processor 110 will obtain the information of the linear region of the sensor 200 (from $S_{bottom}$ to $S_{top}$). The linear region of the sensor 200 may be regarded as the operation region of the sensor 200. When the sensor 200 is operated in the linear region, the sensor 200 may generate a more accurate sensing result.

The processor 110 may define a sensor range, a maximum electronic value, a minimum electronic value and a slope of the linear region according to the linear region of the sensor 200. Using FIG. 3B as an example, the sensor range is from $S_{bottom}$ to $S_{top}$, the maximum electronic value is $E_{top}$, the minimum electronic value is $E_{bottom}$ and the slope of the linear region is $\Delta E/\Delta S$, wherein $\Delta E = E_{top} - E_{bottom}$ and $\Delta S = S_{top} - S_{bottom}$.

Figure 3B:
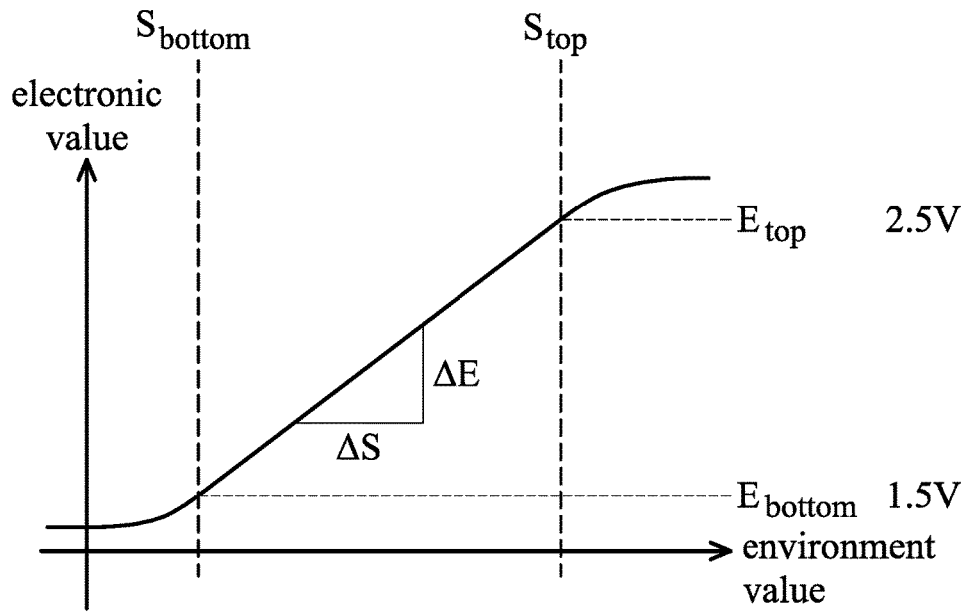

In an embodiment of the disclosure, the driver circuit 130 is coupled to the processor 110 and the sensor 200. When a sensor 200 is connected to the sensor interface circuit 100, the driver circuit 130 may transmit a driving source (e.g. a driving voltage or a driving current) to the sensor 200. In an embodiment of the disclosure, when the processor 110 obtains the information of the linear region (as shown in FIG. 3B) of the sensor 200, the processor 110 may calibrate the value of the driving source according to the linear region of the sensor 200. Namely, when the electronic value of the sensor 200 is over the linear region, the processor 110 will reduce the value of the driving source. In an embodiment of the disclosure, the driver circuit 130 is a programmable driver for different types of sensors. In some embodiments of the disclosure, some kinds of sensors may sense the environment to generate signals directly without the driving source.

In the embodiments of the disclosure, the related parameters corresponding to the linear region and other related property information of the sensor 200 will be stored or recorded in the storage devices 140. Therefore, after the processor 110 has swept the environment values corresponding to the sensor 200 to obtain the information of the linear region and the related parameters corresponding to the linear region of the sensor 200, when the sensor 200 generates the sensor output (or the sensing signal), the processor 110 will read the related information of the sensor 200 from the storage devices 140 without sweeping the environment values corresponding to the sensor 200 again.

In an embodiment of the disclosure, the related property information of the sensor 200 may be stored in the storage devices 140 in advance. For example, the information about the data sheet of the sensor 200 may be stored in the storage devices 140 in advance, wherein the data sheet may comprises the information about the linear region and related property information of the sensor 200. Therefore, in this embodiment of the disclosure, the processor 110 may directly read the property information of the sensor 200 from the storage device 140 to obtain the information of the linear region of the sensor 200 according to the property information. That is to say, the processor 110 does not need to sweep the environment values (or sensor values) that correspond to the sensor 200 to obtain the information of the linear region and other related property information of the sensor 200.

In an embodiment of the disclosure, when the processor 110 has defined the sensor range, the maximum electronic value, the minimum electronic value and the slope of the linear region according to the linear region, the processor 110 may perform a return-to-zero operation and a full-scale operation on the sensor output of the sensor 200 through the gain control circuit 120.

The gain control circuit 120 may perform the return-to-zero operation on the sensor output of the sensor 200. In the return-to-zero operation, the gain control circuit 120 may perform a DC (direct current) level shift operation. That is to say, the electronic values corresponding to the linear region of the sensor 200 may be subtracted a DC level to make the minimum electronic value shift to 0 (or approach to 0). Using FIG. 3B as an example, if the maximum electronic value $E_{top}$ is 2.5 V and the minimum electronic value $E_{bottom}$, is 1.5 V, after the return-to-zero operation, the maximum electronic value $E_{top}$ will be shifted to 1V (2.5V-1.5V) and the minimum electronic value $E_{bottom}$, will be shifted to 0V(1.5V-1.5V). In addition, other electronic values corresponding to the linear region of the sensor 200 will also be subtracted 1.5V.

Figure 3C:
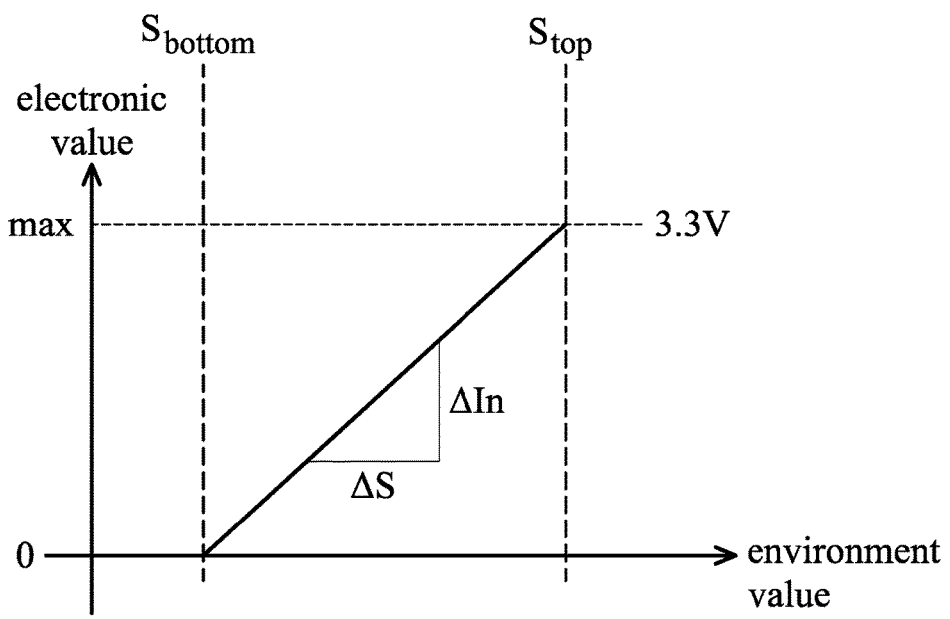

After the return-to-zero operation, the gain control circuit 120 may perform a full-scale operation on the slope of the linear region according to a maximum input range of an analog-to-digital converter (ADC) which is a subsequent-stage circuit of the sensor interface circuit. In the full-scale operation, the electronic values corresponding to the linear region of the sensor 200 will be multiplied by a gain value to make the maximum electronic value change to the maximum input range of the ADC. Using FIGS. 3B and 3C as an example, if the maximum electronic value $E_{top}$ is 1 V and the minimum electronic value $E_{bottom}$ is 0 V after the return-to-zero operation, and the maximum input range of the ADC is 3.3V (max), when the electronic values corresponding to the linear region of the sensor 200 are multiplied by a gain value, the maximum electronic value $E_{top}$ will be changed to the maximum value (3.3V), wherein the gain value is 3.3/(2.5-1.5). After the full-scale operation, the slope of the linear region will be changed. As shown in FIG. 3C, the slope of the linear region will be changed from $\Delta E/\Delta S$ to $\Delta In/\Delta S$. In addition, after the full-scale operation, the linear region of the sensor 200 will be adjusted to the maximum operation range which is applicable to the ADC to increase the resolution of the ADC.

After the return-to-zero operation and full-scale operation, the sensor output can be provided to the ADC and other post devices for the post processing, such as digital signal processing and signal analysis. For different kinds of sensors, after the return-to-zero operation and full-scale operation, the sensor output of the different kinds of sensors may be standardized according to the maximum input range of the ADC. The standardized sensor output can be provided to the ADC and other post devices for the post processing.

Note that, in order to clarify the concept of the disclosure, FIGS. 3A-3C only present an example, and the disclosure should not be limited to what is shown in FIGS. 3A-3C. That is to say, the linear region and the related parameters shown in FIGS. 3A-3C may be different according to different kinds of sensors.

Figure 4:
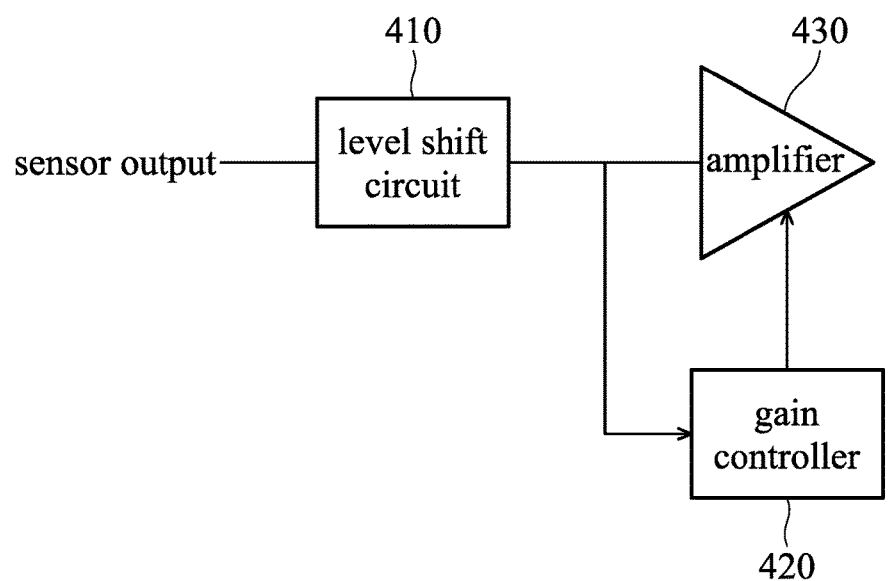
FIG. 4 is a block diagram of the gain control circuit 120 according to an embodiment of the disclosure.

FIG. 4 is a block diagram of the gain control circuit 120 according to an embodiment of the disclosure. As shown in FIG. 4, the gain control circuit 120 may comprise a level shift circuit 410, gain controller 420, and an amplifier 430. The level shift circuit 410 may be a subtractor to perform the return-to-zero operation. The gain controller 420 may determine the gain value according to the maximum input range of the ADC and the output of the level shift circuit 410. The amplifier 430 may be a multiplier to perform the full-scale operation. Note that, in order to clarify the concept of the disclosure, FIG. 4 presents a simplified block diagram in which only the elements relevant to the disclosure are shown. However, the disclosure should not be limited to what is shown in FIG. 4.

In an embodiment of the disclosure, the sensor interface circuit 100 further comprises an offset cancellation circuit (not shown in figures). The offset cancellation circuit is coupled to the gain control circuit 120. The offset cancellation circuit is configured to cancel an offset of the sensor output of the sensor 200 before the sensor output is transmitted to the gain control circuit 120. In an embodiment of the disclosure, the offsets of different sensors may be stored in the storage device 140. In an embodiment of the disclosure, the offset cancellation circuit may be comprised or integrated in the gain control circuit 120.

After the return-to-zero operation and full-scale operation, the processor 110 may set a configuration corresponding to the sensor 200 and store the configuration in the storage device 140. When the sensor 200 generates the new sensor output, the processor 110 will read the configuration corresponding to the sensor 200 from the storage devices 140 without performing the above operations again.

Figure 5A:
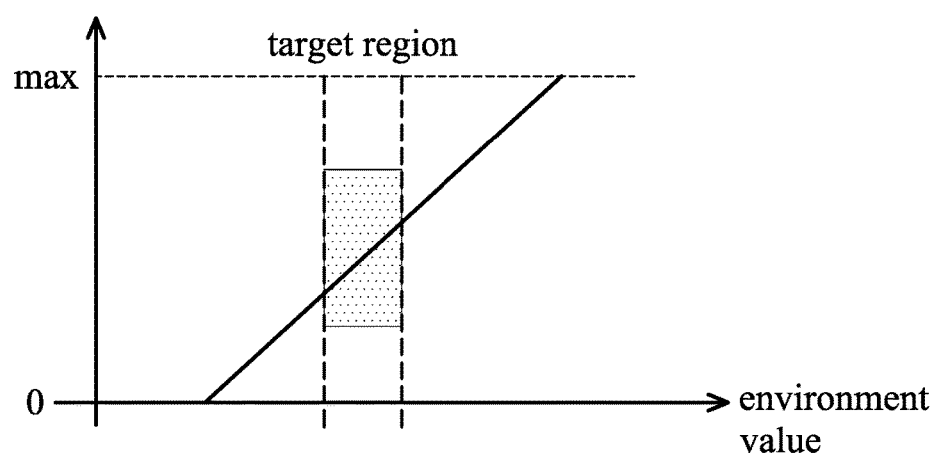
FIGS. 5A-5C are schematic diagrams illustrating the linear region according to another embodiment of the disclosure.
Figure 5B:
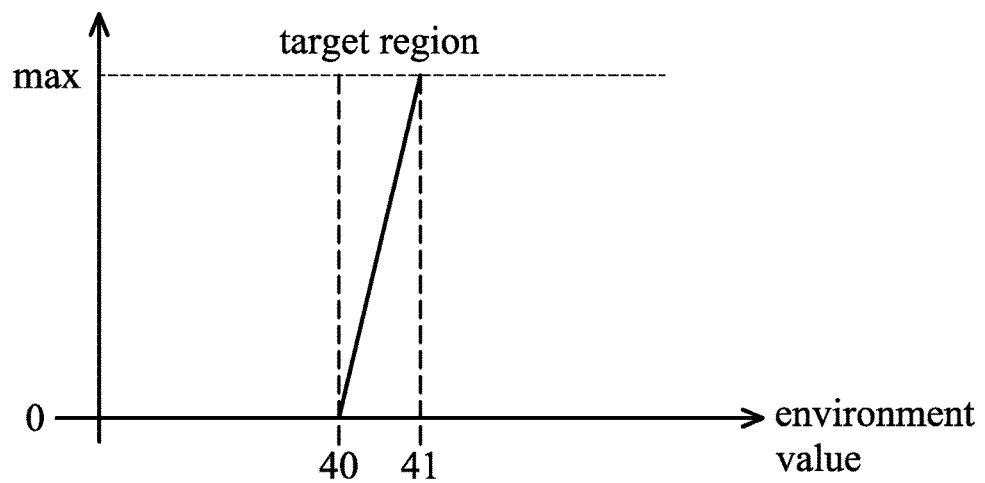
Figure 5C:
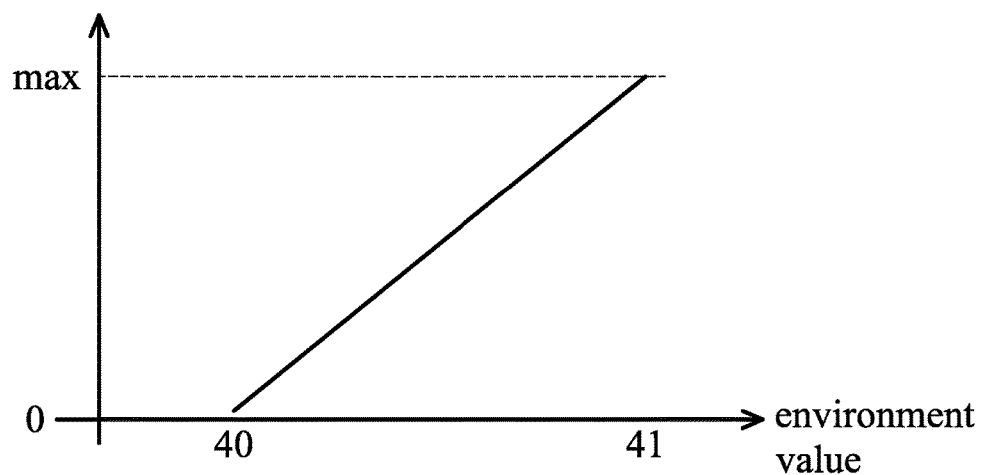

In an embodiment of the disclosure, if a target region of sensor 200 is smaller than the linear region of the sensor 200, the processor 110 may select the target region from the linear region and enlarge the sensor output corresponding to the target region to increase the resolution and accuracy of the ADC. The target region implies that in the current environment, the sensor 200 may sense the signals only in the range of the target region. Using FIGS. 5A-5B as an example, the processor 110 selects the target region (e.g. 40A~41A) from the linear region (as shown FIG. 5A), i.e. the $S_{bottom}$ will be changed to 40 and the $S_{top}$ will be changed to 41. Then the processor 110 enlarges the values corresponding to the target region (as shown in FIGS. 5B and 5C). The "max" in FIGS. 5A-5B means the maximum input range of the ADC. In an embodiment of the disclosure, when the processor 110 sweeps the environment values that correspond to the sensor 200 to obtain the information of a linear region and other related property information of the sensor 200, the processor 110 may directly sweep the environment values corresponding to the target region.

In an embodiment of the disclosure, the sensor interface circuit 100 may comprises a switch circuit 150. The switch circuit 150 may comprises a plurality of switches respectively corresponding to different sensors. The processor 110 may sweep the environment values corresponding to the different types of sensors to obtain the information of the linear regions and other related property information of the different type of sensors and perform the return-to-zero operation and the full-scale operation for the different type of sensors through the time division multiplexing method, i.e. the processor 110 may individually connect to different sensors by switching the switches.

Figure 6:
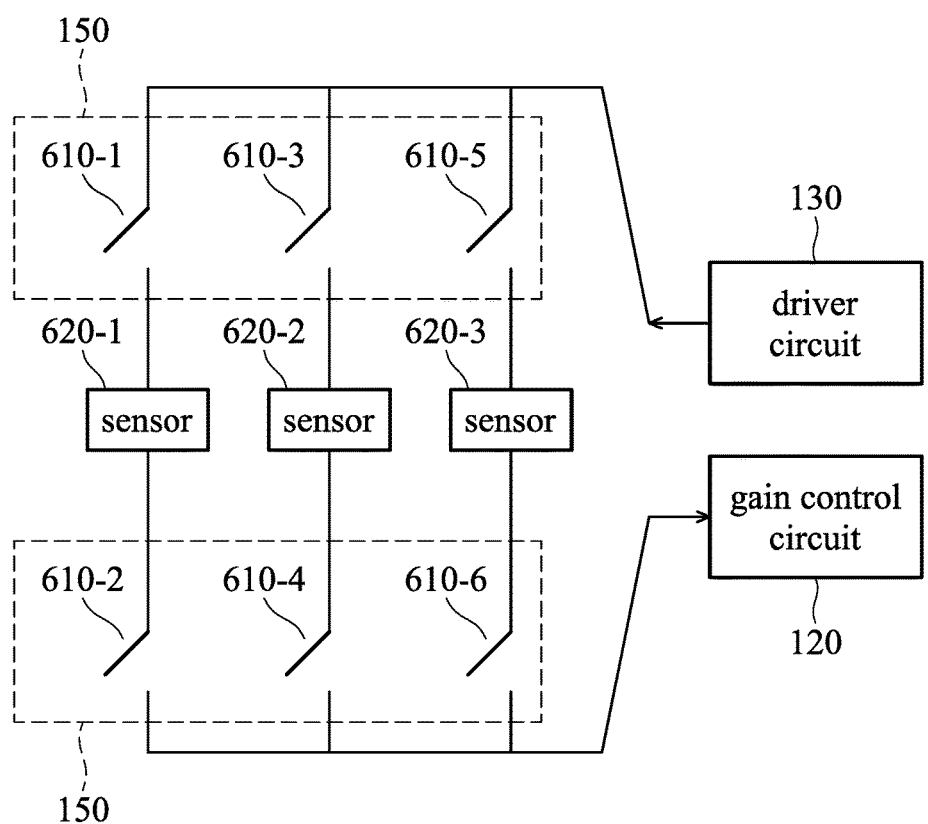
FIG. 6 is a block diagram of the switch circuit 150 according to an embodiment of the disclosure.

FIG. 6 is a block diagram of the switch circuit 150 according to an embodiment of the disclosure. As shown in FIG. 6, in the switch circuit 150, the switch 610-1 may be configured between the driver circuit 130 and the sensor 620-1 and the switch 610-2 may be configured between the gain control circuit 120 and the sensor 620-1; the switch 610-3 may be configured between the driver circuit 130 and the sensor 620-2 and the switch 610-4 may be configured between the gain control circuit 120 and the sensor 620-2; and the switch 610-5 may be configured between the driver circuit 130 and the sensor 620-3 and the switch 610-6 may be configured between the gain control circuit 120 and the sensor 620-3. The processor 110 may sweep the environment values corresponding to sensors 610-1, 610-2 and 610-3 to obtain the information of the linear regions and the other related property information of the sensors 620-1, 620-2 and 620-3 by switching the switches 610-1, 610-2, 610-3, 610-4, 610-5 and 610-6. The linear regions and other related property information of the sensors 620-1, 620-2 and 620-3 may be stored in the storage device 140. In addition, the processor 110 may individually perform the return-to-zero operation and the full-scale operation on the sensor output of the sensors 620-1, 620-2 and 620-3 through the gain control circuit 120. Note that, in order to clarify the concept of the disclosure, FIG. 6 presents a simplified block diagram in which only the elements relevant to the disclosure are shown. However, the disclosure should not be limited to what is shown in FIG. 6.

Figure 7:
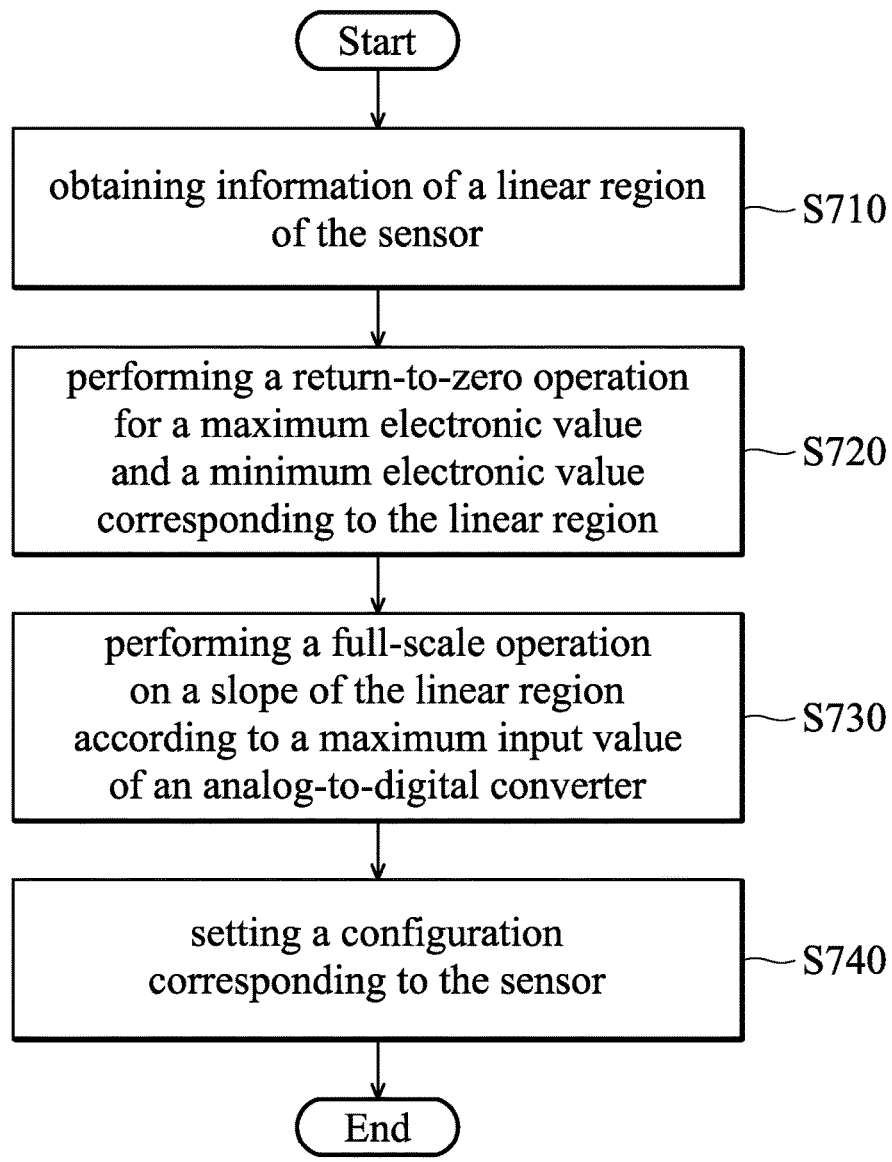
FIG. 7 is a flow chart illustrating the sensor output adjusting method according to an embodiment of the disclosure.

FIG. 7 is a flow chart illustrating the sensor output adjusting method according to an embodiment of the disclosure. The sensor output adjusting method is applied to the sensor interface circuit 100 for the development of the different kinds of sensors. First, in step S710, the sensor interface circuit 100 obtains information of a linear region of the sensor. In step S720, the sensor interface circuit 100 performs a return-to-zero operation for a maximum electronic value and a minimum electronic value corresponding to the linear region. In step S730, the sensor interface circuit 100 performs a full-scale operation on a slope of the linear region according to a maximum input range of an analog-to-digital converter which is a subsequent-stage circuit of the sensor interface circuit. In step S740, the sensor interface circuit 100 sets a configuration corresponding to the sensor. In the embodiment of the disclosure, in the sensor output adjusting method, the sensor interface circuit 100 further stores related parameters corresponding to the linear region and the configuration corresponding to the sensor. In the embodiment of the disclosure, in the sensor output adjusting method, the sensor interface circuit 100 defines a sensor range according to the linear region.

In some embodiments of the disclosure, in the sensor output adjusting method, the sensor interface circuit 100 further transmits a driving source to the sensor and calibrates the value of the driving source according to the linear region of the sensor.

In some embodiments of the disclosure, in step S710, the sensor interface circuit 100 sweeps environment values first and then obtains the information of the linear region of the sensor according to the swept environment values. In some embodiments of the disclosure, in step S710, the sensor interface circuit 100 directly reads the property information of the sensor stored in the storage device in advance to obtain the information of the linear region of the sensor according to the property information.

In some embodiments of the disclosure, in the sensor output adjusting method, the sensor interface circuit 100 further cancels an offset of a sensor output before step S720. In some embodiments of the disclosure, in the sensor output adjusting method, the sensor interface circuit 100 further selects a target region from the linear region and enlarges the sensor output corresponding to the target region.

In the sensor output adjusting method of the disclosure, the sensor interface circuit 100 may be applied to a verification platform for the development of the different kinds of sensors. When different kinds of sensors are developed, the dedicated sensor interface circuit will not be designed respectively for each type of sensor. Therefore, the efficiency and flexibility of the development and the verification for different kinds of the sensors will be increased.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects, any suitable computer-program product may comprise a computer-readable medium comprising codes relating to one or more of the aspects of the disclosure. In some aspects, a computer software product may comprise packaging materials.

It should be noted that although not explicitly specified, one or more steps of the methods described herein can include a step for storing, displaying and/or outputting as required for a particular application. In other words, any data, records, fields, and/or intermediate results discussed in the methods can be stored, displayed, and/or output to another device as required for a particular application. While the foregoing is directed to embodiments of the present disclosure, other and further embodiments of the disclosure can be devised without departing from the basic scope thereof. Various embodiments presented herein, or portions thereof, can be combined to create further embodiments. The above description is of the best-contemplated mode of carrying out the disclosure. This description is made for the purpose of illustrating the general principles of the disclosure and should not be taken in a limiting sense. The scope of the disclosure is best determined by reference to the appended claims.

The above paragraphs describe many aspects. Obviously, the teaching of the disclosure can be accomplished by many methods, and any specific configurations or functions in the disclosed embodiments only present a representative condition. Those who are skilled in this technology will understand that all of the disclosed aspects in the disclosure can be applied independently or be incorporated.

While the disclosure has been described by way of example and in terms of preferred embodiment, it is to be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:

1. A sensor interface circuit, comprising:
   a processor, obtaining information of a linear region of a sensor to set a configuration corresponding to the sensor; and
   a gain control circuit, coupled to the processor, performing a return-to-zero operation for a maximum electronic value and a minimum electronic value corresponding to the linear region and performing a full-scale operation for a slope of the linear region according to a maximum input range of an analog-to-digital converter which is a subsequent-stage circuit of the sensor interface circuit.

2. The sensor interface circuit of claim 1, further comprising:
   a storage device, coupled to the processor and storing related parameters corresponding to the linear region and the configuration corresponding to the sensor.

3. The sensor interface circuit of claim 2, wherein the storage device stores property information of the sensor in advance.

4. The sensor interface circuit of claim 3, wherein the processor reads the property information of the sensor and obtains the information of the linear region of the sensor according to the property information.

5. The sensor interface circuit of claim 1, further comprising:
   a driver circuit, coupled to the processor and transmitting a driving source to the sensor.

6. The sensor interface circuit of claim 5, wherein the processor calibrates a value of the driving source according to the linear region of the sensor.

7. The sensor interface circuit of claim 1, wherein the processor sweeps environment values and obtains the information of the linear region of the sensor according to the swept environment values.

8. The sensor interface circuit of claim 1, wherein the processor defines a sensor range according to the linear region.

9. The sensor interface circuit of claim 1, further comprising:
   an offset cancellation circuit, coupled to the gain control circuit and canceling an offset of a sensor output.

10. The sensor interface circuit of claim 1, wherein the processor selects a target region from the linear region.

11. The sensor interface circuit of claim 1, further comprising:
a switch circuit, coupled to the gain control circuit and comprising a plurality of switches, wherein the processor individually connect to different sensors by switching the switches.

12. A sensor output adjusting method for a sensor, comprising:
obtaining information of a linear region of the sensor;
performing a return-to-zero operation for a maximum electronic value and a minimum electronic value corresponding to the linear region; and
performing a full-scale operation for a slope of the linear region according to a maximum input range of an analog-to-digital converter; and
setting a configuration corresponding to the sensor.

13. The sensor output adjusting method of claim 12, further comprising:
storing related parameters corresponding to the linear region and the configuration corresponding to the sensor.

14. The sensor output adjusting method of claim 13, further comprising:
storing property information of the sensor in advance.

15. The sensor output adjusting method of claim 14, further comprising
reading the property information of the sensor; and
obtaining the information of the linear region of the sensor according to the property information.

16. The sensor output adjusting method of claim 12, further comprising:
transmitting a driving source to the sensor.

17. The sensor output adjusting method of claim 16, further comprising:
calibrating a value of the driving source according to the linear region of the sensor.

18. The sensor output adjusting method of claim 12, further comprising:
sweeping environment values; and
obtaining the information of the linear region of the sensor according to the swept environment values.

19. The sensor output adjusting method of claim 12, further comprising
defining a sensor range according to the linear region.

20. The sensor output adjusting method of claim 12, further comprising:
canceling an offset of a sensor output.

21. The sensor output adjusting method of claim 12, further comprising:
selecting a target region from the linear region.

22. The sensor output adjusting method of claim 12, further comprising:
individually connecting to different sensors by switching a switch circuit to set configurations corresponding to the different sensors.

* * * * *